(12) United States Patent  (10) Patent No.: US 8,928,386 B1
Ganusov et al.  (45) Date of Patent: Jan. 6, 2015

(54) CIRCUITS FOR AND METHODS OF ASYCHRONOUSLY TRANSMITTING DATA IN AN INTEGRATED CIRCUIT

(71) Applicant: Xilinx, Inc., San Jose, CA (US)

(72) Inventors: Ilya Ganusov, San Jose, CA (US); Brian C. Gaide, Erie, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/797,791

(22) Filed: Mar. 12, 2013

(51) Int. Cl.
  *H03K 3/00* (2006.01)
  *H03K 5/13* (2014.01)
  *G06F 13/40* (2006.01)
  *H04L 1/00* (2006.01)

(52) U.S. Cl.
  CPC ............ *H03K 5/13* (2013.01); *G06F 13/4009* (2013.01); *H04L 1/0052* (2013.01)
  USPC .......................................... 327/293; 710/106

(58) Field of Classification Search
  CPC ............ G06F 13/4009; G06F 13/4004; G06F 17/5059; G06F 17/3864; H04F 1/0043; H04L 1/0052; H04L 1/0041; H04L 1/0042; H04L 1/0045
  USPC ............................. 327/293, 295, 299; 710/106
  See application file for complete search history.

(56) References Cited

U.S. PATENT DOCUMENTS

| | | | |
|---|---|---|---|
| 5,553,276 A * | 9/1996 | Dean | 713/500 |
| 6,848,060 B2 * | 1/2005 | Cook et al. | 713/400 |
| 7,739,628 B2 * | 6/2010 | Manohar et al. | 716/103 |
| 7,746,103 B1 * | 6/2010 | Gaide et al. | 326/38 |
| 8,228,107 B2 * | 7/2012 | Kao | 327/298 |
| 8,358,148 B1 * | 1/2013 | Kaviani | 326/38 |
| 2008/0123765 A1 * | 5/2008 | Oh et al. | 375/267 |
| 2009/0006687 A1 * | 1/2009 | Shibata | 710/106 |
| 2009/0106719 A1 * | 4/2009 | Stevens | 716/6 |
| 2011/0169525 A1 * | 7/2011 | Gill et al. | 326/39 |
| 2011/0196997 A1 * | 8/2011 | Ruberg et al. | 710/71 |

OTHER PUBLICATIONS

Naveena, K. et al., "A Low Power Asynchronous FPGA With Power Gating and Dual Rail Encoding", IJCSET, Mar. 2012, vol. 2, Issue 3, pp. 949-952, Coimbatore, India.

* cited by examiner

*Primary Examiner* — Thomas J Hiltunen
(74) *Attorney, Agent, or Firm* — John J. King

(57) ABSTRACT

A circuit for asynchronously transmitting data in an integrated circuit is described. The circuit comprises a transmitter circuit generating data to be transmitted at an output; a first register having an input, an output and a clock input, wherein the input of the first register is coupled to the output of the transmitter and the clock input of the first register is coupled to receive a clock signal; at least one asynchronous buffer having an input and an output, wherein the input is coupled to the output of the first register; a receiver circuit coupled to the output of the at least one buffer; and a second register having an input, and output and a clock input, wherein the input of the at least one asynchronous buffer is coupled to the output of the transmitter and the clock input of the second register is coupled to receive the clock signal. A method of implementing of asynchronously transmitting data in an integrated circuit device is also disclosed.

17 Claims, 7 Drawing Sheets

US 8,928,386 B1

CIRCUITS FOR AND METHODS OF ASYNCHRONOUSLY TRANSMITTING DATA IN AN INTEGRATED CIRCUIT

FIELD OF THE INVENTION

The present invention relates generally to integrated circuit devices, and in particular, to circuits for and methods of asynchronously transmitting data in an integrated circuit.

BACKGROUND OF THE INVENTION

The transfer of data is an important aspect of any integrated circuit device. While data may be transferred between integrated circuit devices, one important aspect of any integrated circuit device is the efficient transfer of data within an integrated circuit. As integrated circuits continue to evolve, the number of voltage and frequency domains is rapidly increasing. With a greater number of voltages and frequency domains, additional circuits must be implemented to accommodate the voltages and frequency domains. More complex timing control circuits are also required to enable the operation of circuits implemented in the various frequency domains.

In devices having programmable resources, a significant amount of interconnects is required for programmability. Further, conventional integrated circuit devices which enable synchronous communication have high area overhead to provide the necessary clock signals. Such clocking structures also require circuits to account for skew in the communication of data over various paths in the circuit. Because errors in data transmission must be eliminated or at least maintained within some acceptable level, it is necessary to allow addition time for the transfer of data to ensure that the data is properly transferred. Accordingly, conventional integrated circuit devices have considerable drawbacks associated with the transfer of data.

SUMMARY OF THE INVENTION

A circuit for asynchronously transmitting data in an integrated circuit is described. The circuit comprises a transmitter circuit generating data to be transmitted at an output; a first register having an input, an output and a clock input, wherein the input of the first register is coupled to the output of the transmitter and the clock input of the first register is coupled to receive a clock signal; at least one asynchronous buffer having an input and an output, wherein the input is coupled to the output of the first register; a receiver circuit coupled to the output of the at least one buffer; and a second register having an input, and output and a clock input, wherein the input of the at least one asynchronous buffer is coupled to the output of the transmitter and the clock input of the second register is coupled to receive the clock signal.

A circuit for asynchronously transmitting data in an integrated circuit according to an alternate arrangement comprises a transmitter circuit implemented in a first configurable block, wherein data output by the transmitter circuit is generated at an output of a first lookup table of the first configurable block; at least one asynchronous buffer implemented in a second configurable block, wherein an input of the at least one asynchronous buffer is coupled to an output of an output register of the first configurable block; and a receiver circuit implemented in a third configurable block, wherein an input of the receiver circuit is coupled to an output a second lookup table of the second configurable block and an output of a lookup table of the third configurable block is coupled to an output register of the third configurable block.

A method of asynchronously transmitting data in an integrated circuit is also described. The method comprises generating data at an output of a transmitter circuit; storing the data generated at the output of the transmitter circuit in response to a clock signal; coupling the stored data to at least one asynchronous buffer; and storing an output of the at least one asynchronous buffer in response to the clock signal.

DETAILED DESCRIPTION OF THE DRAWINGS

Figure 1:
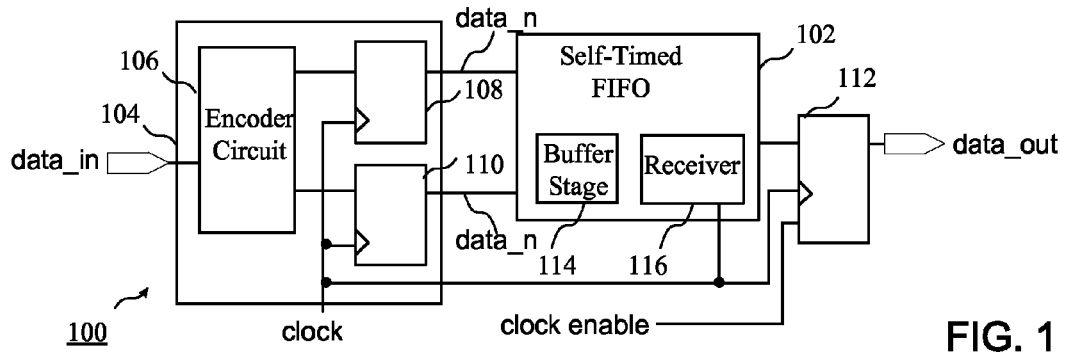
FIG. 1 is a block diagram of a circuit for asynchronously transmitting data.

Turning first to FIG. 1, a block diagram of a circuit for asynchronously transmitting data is shown. In particular, a circuit 100 comprises a self-timed first-in first-out (FIFO) 102 coupled to a transmitter circuit 104 which will be described in more detail in reference to FIG. 2. The transmitter circuit 104 comprises an encoder circuit 106 receiving input data (data_in) at an input of the circuit, and generating encoded data at two outputs which are coupled to corresponding data inputs of registers 108 and 110, respectively. An encoder circuit and encoding protocols will be described in more detail below. A register 112 is also coupled to an output of the self-timed FIFO circuit 102. The self-timed FIFO comprises a buffer stage 114 and a receiver stage 116, which will be described in more detail in reference to FIGS. 3 and 4 below.

The circuit arrangements set forth above enable circuit designs, such as circuit designs implemented in integrated circuit devices having programmable resources, to be asynchronously pipelined to achieve a higher operating frequency while using resources that already exist in synchronous devices, such as an FPGA. Instead of using registers to pipeline the design, asynchronous FIFOs are created out of lookup tables (LUTs) and registers and inserted at the end of critical paths to allow for multiple data tokens to be in flight simultaneously, thereby increasing throughput. Using asynchronous FIFOs instead of registers alone enables better placement/routing flexibility and higher throughput.

The various circuits and methods set forth below provide a more flexible placement. Instead of requiring registers to be placed at locations along the critical path to break it into segments (where each of which satisfies a maximum frequency requirement), a FIFO is placed at the end of the path. The various circuit arrangements set forth below are advantageous when the number of available registers is low in the vicinity where they are needed or when control set restrictions limit the usability of available resister sites.

The various circuits and methods also provide better performance. Placement inflexibility and delays in routing to get to a nearby register become prohibitive at higher frequencies because it requires multiple transfers to get from the global interconnect elements through local interconnect elements to the CLB register and back out. In contrast, the asynchronous FIFO circuits set forth below do not require transferring on/off interconnects for every pipeline stage, and a higher maximum frequency can be achieved compared to a design pipelined with registers. That is, by implementing asynchronous FIFOs as shown below, critical paths can be clocked at a faster rate than their innate delay would allow.

Figure 2:
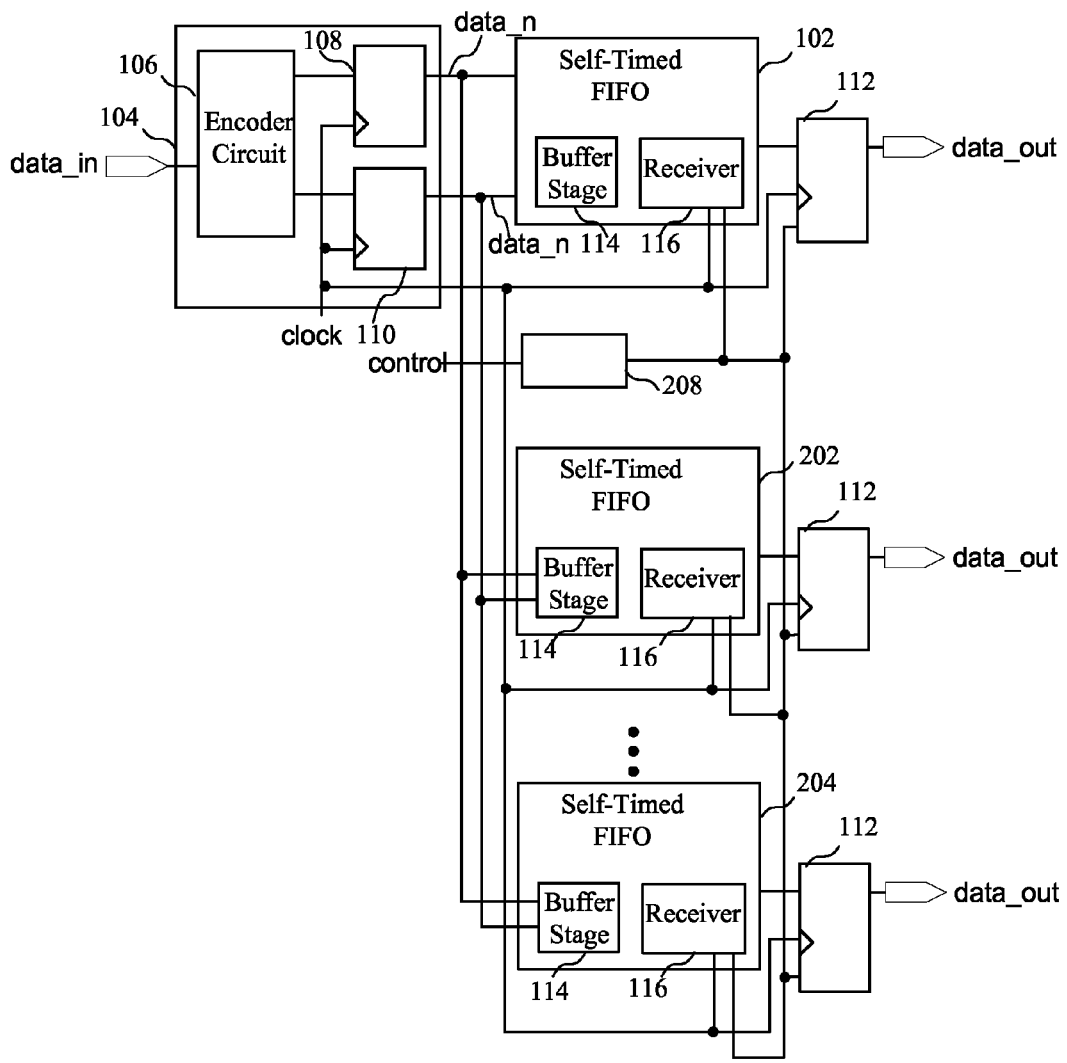
FIG. 2 is a block diagram of a circuit for asynchronously transmitting data having a plurality of fanouts.

As shown in the embodiment of FIG. 2, the outputs of the transmitter circuit 104 may be routed to a number of destinations by a plurality of self-timed FIFOs 102. Because it may take different amounts of time for data to fill the buffer stages of the various self-timed FIFOs, it is beneficial to include a circuit which will prevent a clock enable from enabling the registers 112 of the destinations until the data has filled the buffers of the buffer stage in the slowest destination path. Accordingly, clock gating circuitry 208 can be used to allow the data to fill the buffer stages to avoid any timing problems, and guarantee that the next bit of data arrives to the receiver on time.

The clock gating circuitry 208 will generate a low output, during an initial period until all of the data has filled all of the buffer stages. After an initialization period, the control signal will enable the clock gating circuitry 208 to generate a high output, where the clock enable signal will follow the clock signal. The clock gating circuitry 208 could be a delay element set to a predetermined delay, a FIFO coupled to receive a number of logical zero bits before a continuous string of logical one bits, or a counter which generates a logical one output after a predetermined count. The delay provided by the delay element may correspond to the number of stages of the buffer stages. That is, a delay corresponding to the number of clock signals will ensure that the data has reached the last buffer of the buffer stages. However, it should be understood that other circuits could be employed to provide a necessary delay to ensure that all of the buffer stages are filled with data.

Figure 3:
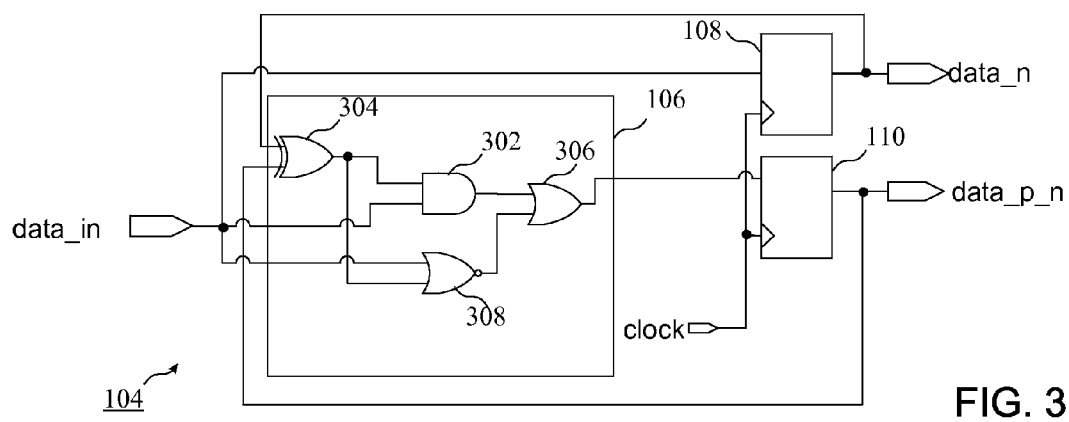
FIG. 3 is a block diagram of the transmitter circuit of the circuit of FIG. 1.

Turning now to FIG. 3, a block diagram of an encoder circuit of the circuit of FIG. 1 is shown. In particular, the encoder circuit comprises an AND gate 302 coupled to receive the output of an exclusive OR (XOR) gate 304 and the input data. An OR gate 306 is coupled to receive the output of the AND gate 302 at a first input and output of a NOR gate 308, which is coupled to receive the input data at a first input and an output of the XOR gate 304 at a second input. The register 108 is coupled to receive the input data and generate a first output (data_n) associated with a pair of data signals at an output, while the register 110 is coupled to receive the output of the OR gate 306 of encoder circuit 106 to generate the second output associated with the parity data (data_p) of the pair of data signals. Each of the registers 108 and 110 receive a clock enable (CE) signal and the clock signal. As will be described in more detail below, the clock signal is used to latch data in registers located at a first end of a path, enabling the data to be pipelined by the asynchronous buffers between the registers. The number of buffer stages are selected based upon the desired operation speed of the circuit, but must be of a length which enables data to propagate through the pipeline stages within one clock cycle.

According to the embodiment of FIG. 3, the encoder circuit 102 is implemented according to a level encoded dual-rail (LEDR) format. The encoding scheme (LEDR) minimizes power consumption by forcing only one wire to toggle once on any clock edge. As shown in the following table, only one value of the data or parity data will change in response to any change in the input data, where the data is transferred using alternating even and odd phases for each data value. By implementing the alternating even and odd phases, only a single data value of the pair of data values will need to be changed.

| Phase | Parity Input | Data Input | Output |
|-------|--------------|------------|--------|
| Even  | 0            | 0          | 0      |
| Even  | 1            | 1          | 1      |
| Odd   | 1            | 0          | 0      |
| Odd   | 0            | 1          | 1      |

In order to prevent race conditions, the feedbacks for the buffer must utilize fast routing connections to assure they stabilize before the next wave of data arrives. However, using the self-timed FIFO approach enables some amount of skew between the delay of the two wires. That is, there is some acceptable window of delay where the wires need not have matched delay. While a circuit implementing the LEDR format is shown, it should be understood that other formats for converting single rail data to dual rail data such as "1 of 2" encoding could be used. Also, circuits implementing a 4-phase protocol could be implemented in the buffer stage. While a 4-phase protocol may be power intensive, it may lead to area savings in some architectures. It should be understood that any asynchronous protocol could be implemented in the buffer stage between the registers in the various circuits set forth above.

Figure 4:
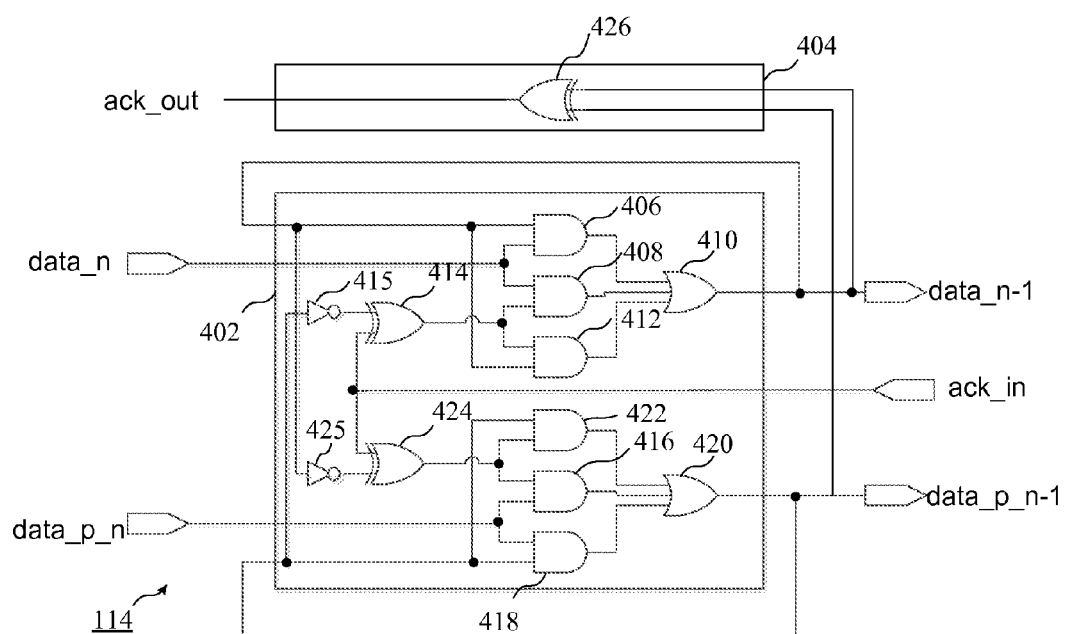
FIG. 4 is a circuit diagram of a buffer stage of the circuit of FIG. 1.

Turning now to FIG. 4, a circuit diagram of a buffer stage of the circuit of FIG. 1 is shown. More particularly, a buffer circuit 402 is coupled to receive the current data (data_n) and parity data (data_p) and generate previous data (data_n−1) and parity data (data_p_n−1) based upon the current data at two outputs. That is, the circuit elements of the buffer circuit 402 enables passing previous input data coupled to the buffer as output data in response to the new input data to the buffer. The data generated at the outputs of the buffer circuit 402 is coupled to an acknowledgement circuit 404 which generates an acknowledgement output (ack_out) signal. The buffer circuit 402 comprises a first AND gate 406 and a second AND gate 408, each of which is coupled to receive the data_n value, and an output of an OR gate 410. The OR gate 410 receives the output of each of the AND gates 406 and 408, and a third AND gate 412. The third AND gate 412 is also coupled to the output of the OR gate 410 at a first input and the output of an XOR gate 414, which is coupled to receive the output of an inverter 415 and an acknowledgement input (ack_in) signal. The output of the XOR gate 414 is also coupled to an output of the AND gate 408.

The buffer circuit 402 also comprises a fourth AND gate 416 and a fifth AND gate 418, each of which is coupled to receive the parity data (data_p_n), and an output of an OR gate 420. The OR gate receives the output of each of the AND gates 416 and 418, and a sixth AND gate 422. The sixth AND gate 422 is coupled to the output of the XOR gate 424 at a second input, which is coupled to the output of the inverter 425 and to receive the ack_in signal. The output of the XOR gate 424 is coupled to an output of the AND gate 416.

Figure 5:
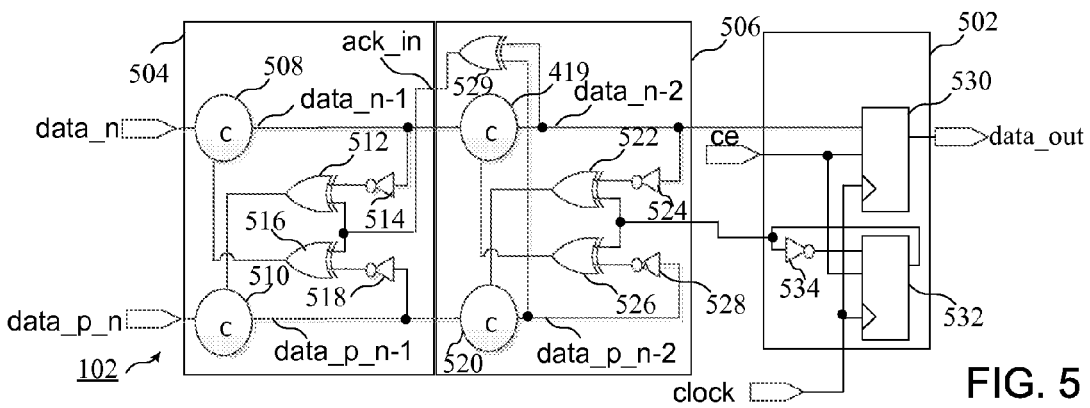
FIG. 5 is a block diagram showing a combined buffer stage and a receiver circuit.

The buffer circuit also includes elements for enabling asynchronous communication. In addition to the XOR gates 414 and 424 which receive the ack_in signal to enable asynchronous communication, the acknowledgement circuit 404 comprises an XOR gate 426 which is coupled to receive the outputs of the buffer stage data_n−1 and data_p_n−1, and generate an acknowledgement output (ack_out) signal. It should be noted that the ack_out signal is coupled to a previous buffer stage as an ack_in signal for all stages except the first stage, where the input data is provided to the first stage as latched outputs data_n and data_p_n of the latches 108 and 110. That is, new input data to the self-timed FIFO 102 will be clocked data and would not need to be generated in response to an acknowledgement signal. As will be described in more detail below in reference to FIG. 5, the acknowledgement signal for a given buffer circuit is generated from a buffer element which follows, or from a decoder circuit for the last buffer element. While only a single buffer circuit is shown for the buffer stage of FIG. 4, it should be understood that a plurality of buffer stages could be implemented as shown in FIG. 5. Further, while the buffer circuit of FIG. 4 implements the LEDR protocol, the buffer circuit could be configured to implement any type of dual-rail protocol.

Turning now to FIG. 5, a block diagram showing a combined buffer stage and a receiver element is shown. In particular, a decoder stage 502 is coupled to a plurality of buffers, shown here as two buffers 504 and 506. The first buffer 504 comprises a "C" element 508 coupled to receive the input data data_n and a "C" element 510 coupled to receive the parity data data_p. An output of a "C" element reflects the inputs when the states of all inputs match. The output then remains in this state until its inputs all transition to the other state. An example of a "C" element will be described in reference to FIG. 6. The buffer also comprises an XOR gate 512 coupled at an output of an inverter 414, which is coupled to an output of the "C" element 508. An XOR gate 516 is coupled to receive an output of an inverter 518 which is coupled to receive an output of the "C" element 510. Each of the "C" elements 508 and 510 is also coupled to receive an acknowledgement input signal from the following buffer 406 by way of the XOR gates 516 and 512, respectively.

The second buffer 506 comprises a "C" element 519 coupled to receive the previous data (data_n−1) and a "C" element 520 coupled to receive the previous parity data (data_p_n−1) at the output of the first buffer. The second buffer also comprises an XOR gate 522 coupled at an output of an inverter 524, which is coupled to an output of the "C" element 519. An XOR gate 526 is coupled to receive an output of an inverter 528 which is coupled to receive an output of the "C" element 520. Each of the "C" elements 519 and 520 are also coupled to receive an acknowledgement input signal from decoder stage 402 by way of the XOR gates 526 and 522, respectively. The second buffer comprises an XOR gate 529 which is coupled to the outputs of each of the "C" elements 519 and 520. The XOR gate 529 generates an ack_out signal as set forth above with respect to FIG. 4.

The decoder stage 502 comprises a first register 530 coupled to receive the output of the "C" element 519 of the buffer 506 and a second register 532 coupled to receive an inverted feedback output at an output of the inverter 534. The output of the register 532 is also coupled to the XOR gates 522 and 526 as an acknowledgement signal as set forth above. Each of the registers 530 and 532 receive the clock enable and clock signals as shown. In an initial state, an acknowledgement signal which is sent by the register 532 is propagated through the buffer stage to allow the buffers to receive the data. As shown in the embodiment of FIG. 5, the output register 530 is a part of the receiver circuit implemented as a decoder stage 502.

Figure 6:
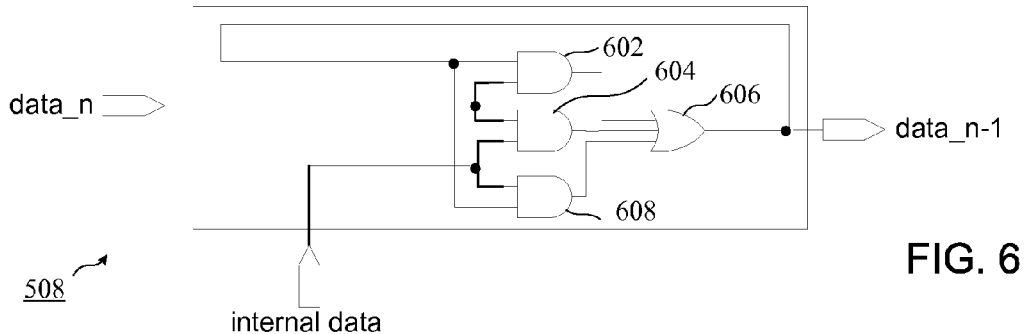
FIG. 6 is circuit diagram of a "C" element of the circuit of FIG. 5.

Turning now to FIG. 6, circuit diagram of a "C" element of FIG. 5 is shown. The "C" element circuits of FIG. 5 comprise a first AND gate 602 and a second AND gate 604, each of which is coupled to receive the input data. An OR gate 606 receives the output of each of the AND gates 602 and 604, and a third AND gate 608. The output of the OR gate 606 is coupled to each of the AND gates 602 and 608. Also, each of the AND gates 604 and 608 receives internal data associated with the output of another "C" element of the buffer, as shown for example in FIG. 5. As set forth above, an output of the "C" element will reflect the inputs when the states of all inputs match, and remain in this state until its inputs all transition to the other state. While the example of a "C" element is shown by way of example, it should be understood that the functionality of the "C" element could be implemented by another circuit.

Figure 7:
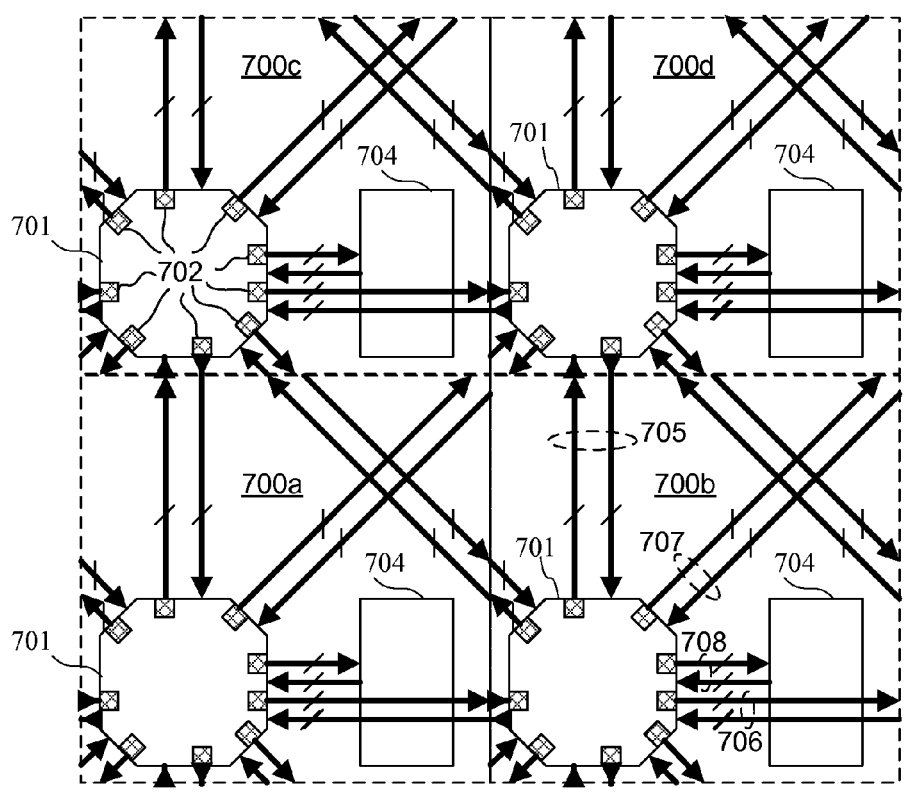
FIG. 7 is a block diagram of a portion of an integrated circuit device implementing elements enabling the asynchronous transfer of data.

Turning now to FIG. 7, a block diagram of a portion of an integrated circuit device implementing elements 700 enabling the asynchronous transfer of data is shown. That is, the elements of the circuit of FIG. 1 can be implemented in an organized arrangement, where programmable interconnect points can route data between registers and asynchronous buffers, as set forth above. As will be described in more detail below, the buffers and registers can be implemented in configurable logic blocks of an integrated circuit, such as the configurable logic blocks described in FIGS. 9 and 10.

FIG. 7 illustrates an integrated circuit in which the outputs of each programmable routing structure 701 are coupled to drive either an input of another routing structure having a programmable interconnect point 702, or an input of one of the circuit blocks 704. The output of each circuit block is coupled to drive an input of a corresponding programmable routing structure. As shown in FIG. 7, each routing structure is coupled to vertical interconnect lines 705, horizontal interconnect lines 706, and diagonal interconnect lines 707. Interconnects 708 are provided between a programmable routing structure and a corresponding circuit block 704. Note that interconnect lines 705-708 may be single lines or multi-bit busses. For example, in one embodiment each interconnect line 705-708 is an 8-bit bus, and also includes supporting signals.

Additionally, the interconnect lines in the embodiments described herein are all unidirectional. Unidirectional interconnect lines may permit a more efficient implementation of a pipelined programmable routing structure, because the overall number of routing multiplexers can be reduced relative to a bidirectional implementation. However, it should be understood that bi-directional signal lines could also be employed. The interconnect lines shown in FIG. 6 are all "singles." That is, they connect a routing structure to another routing structure in an adjacent tile, either vertically adjacent (by way of interconnect lines 705), horizontally adjacent (by way of interconnect lines 706), or diagonally adjacent (by way of interconnect lines 707).

Interconnect lines in this type of integrated circuit architecture may include "doubles," which connect to a routing structure in a circuit block which is two circuit blocks away, "quads," which connect to a routing structure in a circuit block which is four circuit blocks away, and/or interconnect lines of other lengths. While interconnect lines other than singles are omitted from FIG. 7 for clarity, it should be understood that some arrangements may include such interconnect lines.

Each element 700 comprises both a programmable routing structure 702 and a circuit block 704 which will enable asynchronous transfer of data by implementing asynchronous buffers between registers, where the number of asynchronous buffers between registers can be determined by the programmable routing structures 702 and the configuration of the circuit blocks 704. For example, the programmable routing structures may be implemented to route data between each of the elements of FIG. 1, where one CLB of a circuit block 604 would be implemented as a transmitter, one CLB of a circuit block 704 would be implemented as a receiver, and at least one CLB of a circuit block 704 would be implemented as an asynchronous buffer.

Figure 8:
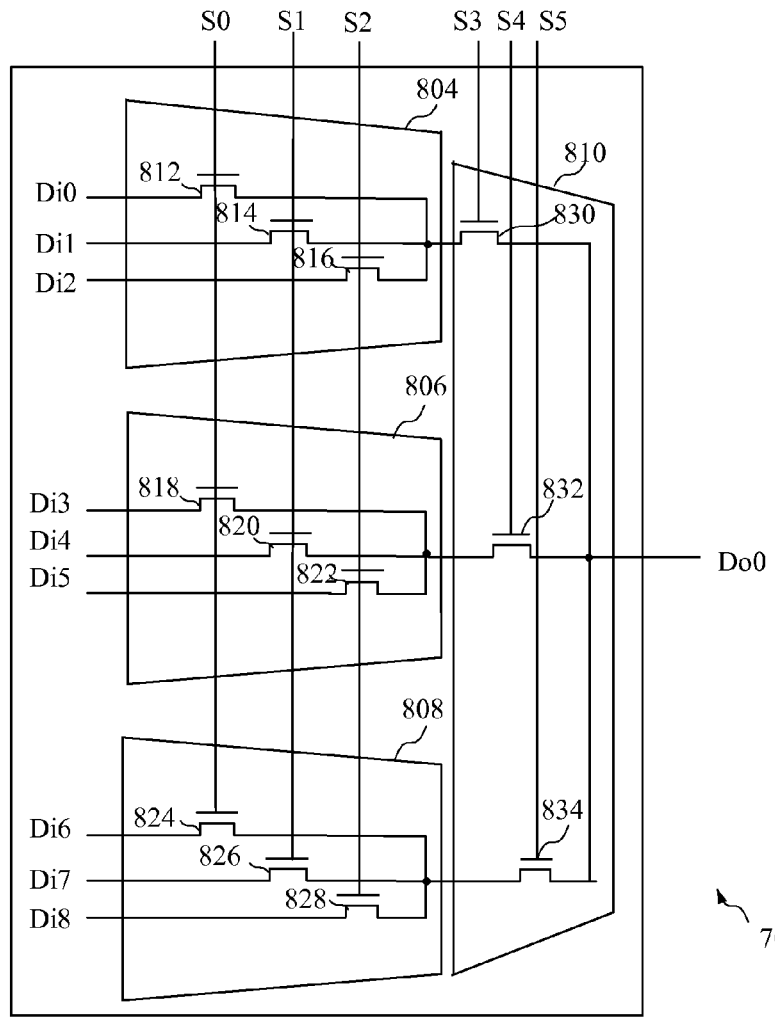
FIG. 8 is a block diagram of a programmable interconnect point of FIG. 7.

Turning now to FIG. 8, a block diagram of a programmable interconnect point is shown. Each programmable interconnect point 702 may include a nine-to-one multiplexer which is coupled to select one of the inputs Di0 to Di8 as an output Do_0. However, it should be understood that a nine-to-one multiplexer is provided by way of example, and that other arrangements of multiplexer circuits could be provided depending upon the configuration of circuit elements of the integrated circuit. The multiplexer includes a first stage having multiplexers 804, 806, and 808, and a second stage having a multiplexer 810. Select signals S0-S5 control the multiplexers. Select signals S0-S2 select an output for each multiplexer 804-808 of the first stage of the multiplexer portion 802. In particular, select signals S0-S2 are coupled to the gates of transistors 812-816, respectively, to select one of the inputs Di0-Di2. Select signals S0 -S2 are also coupled to the gates of transistors 818-822, respectively, to select one of the inputs Di3-Di5. Finally, select signals S0-S2 are coupled to the gates of transistors 824-828, respectively, to select one of the inputs Di6-Di8. Multiplexer 810 in the second stage receives select signals S3-S5 at the gates of transistors 830-834, respectively, to select the output of one of the multiplexers 804-808 as an input to the output buffer 703. The output buffer 703 is implemented as a latch comprising inverters 736 and 738 coupled in series at a node 740 which is coupled to a gate of a transistor 742. Accordingly, the programmable interconnect points 702 enables the transfer of input data from one of a number of inputs to an output as output data Do0.

The nine-to-one multiplexer of FIG. 8, which enables the operation of an integrated circuit architecture shown in FIG. 7, is shown by way of example. That is, the programmable interconnect points shown in FIG. 8 enable the selection of an input from one of an adjacent circuit block on each of eight "sides" of the circuit block or an output of the circuit block, as shown in the circuit arrangement of FIG. 7. However, it should be understood that other circuit arrangements of circuit blocks, and therefore other configurations of programmable interconnect points could be employed. It should further be apparent that the configuration of a programmable interconnect point may be different for enabling the communication of data within a circuit block. As will be described in more detail below, data may be transmitted as dual rail data. Accordingly, two programmable interconnect points of FIG. 8 would be implemented together to enable the dual rail data.

Figure 9:
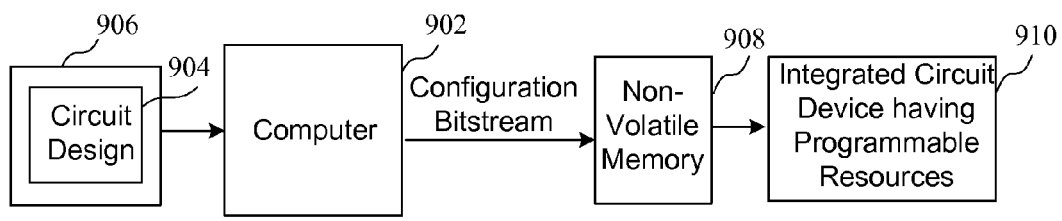
FIG. 9 is a block diagram of a system for programming a device having programmable resources.

Turning now to FIG. 9, a block diagram of a system for programming a device having programmable resources according to an embodiment is shown. In particular, a computer 902 is coupled to receive a circuit design 904 from a memory 906, and generate a configuration bitstream which is stored in the non-volatile memory 906. As will be described in more detail below, the circuit design may be a high level design, such as a circuit design defined in a hardware description language (HDL). Also, the computer may be configured to run software that generates a configuration bitstream which is stored in the non-volatile memory 908 and provided to an integrated circuit 910 which may be a programmable integrated circuit, such as the integrated circuit described below in FIG. 10.

Figure 10:
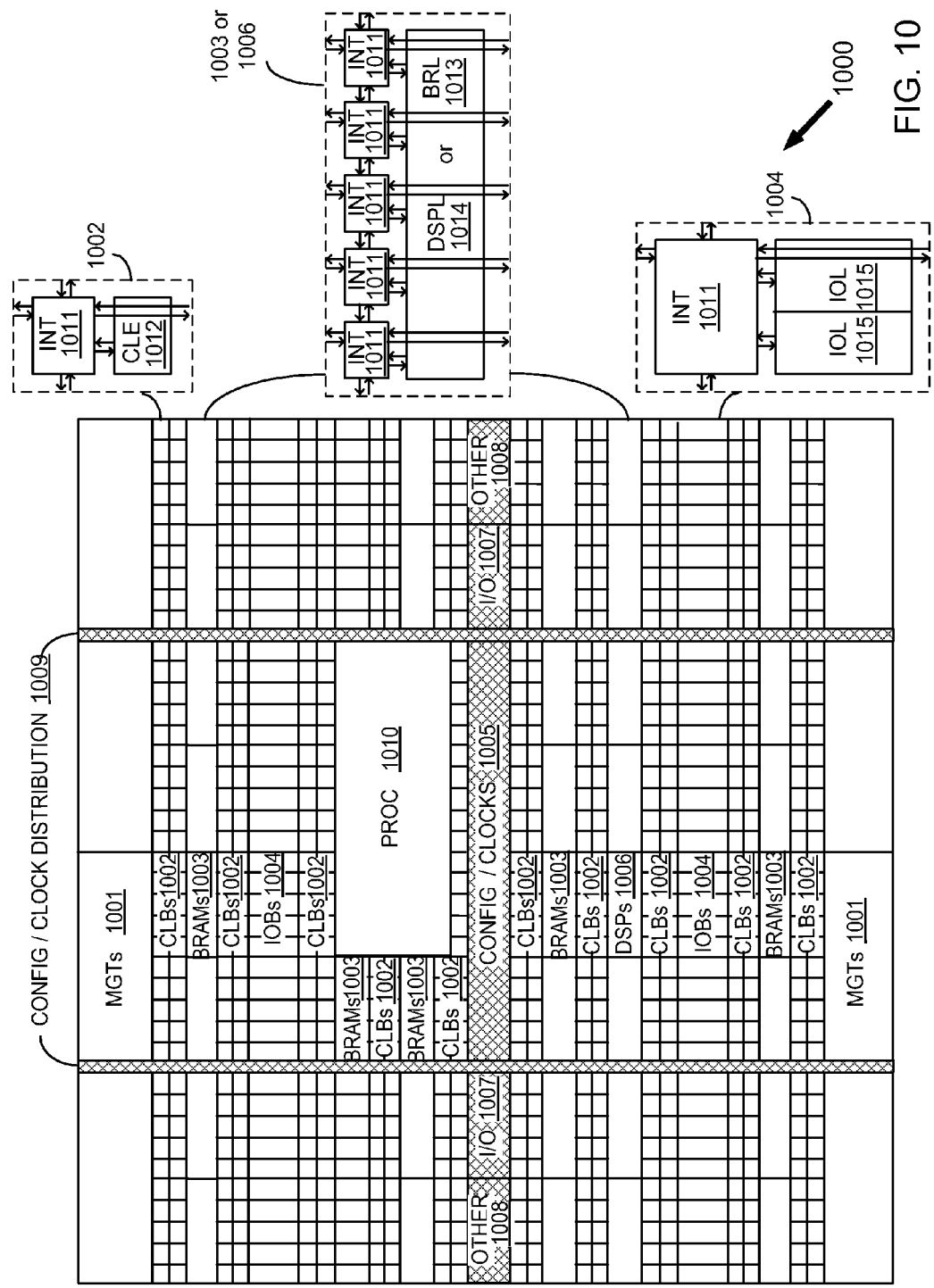
FIG. 10 is a block diagram of a device having programmable resources which may implement the circuits of FIGS. 1-8.

Turning now to FIG. 10, a block diagram of a device having programmable resources including the circuits of FIGS. 2-8 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1006 may include a DSP logic element (DSPL) 1014 in addition to an appropriate number of programmable interconnect elements. An IOB 1004 may include, for example, two instances of an input/output logic element (IOL) 1015 in addition to one instance of the programmable interconnect element 1011. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 909 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

The FPGA of FIG. 10 further comprises enhanced memory elements 1016 which are larger than the BRAMs 1003. The enhanced memory elements 1016 may comprise an SRAM block and dedicated interconnect elements, separate from the various interconnect elements described in reference to blocks of the circuit 1000, enabling access to memory elements of the enhanced memory elements by blocks of the circuit 1000 or devices external to the circuit 1000.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the embodiment of FIG. 10 relates to an integrated circuit having programmable resources, it should be understood that the circuits and methods set forth in more detail below could be implemented in any type of ASIC.

Figure 11:
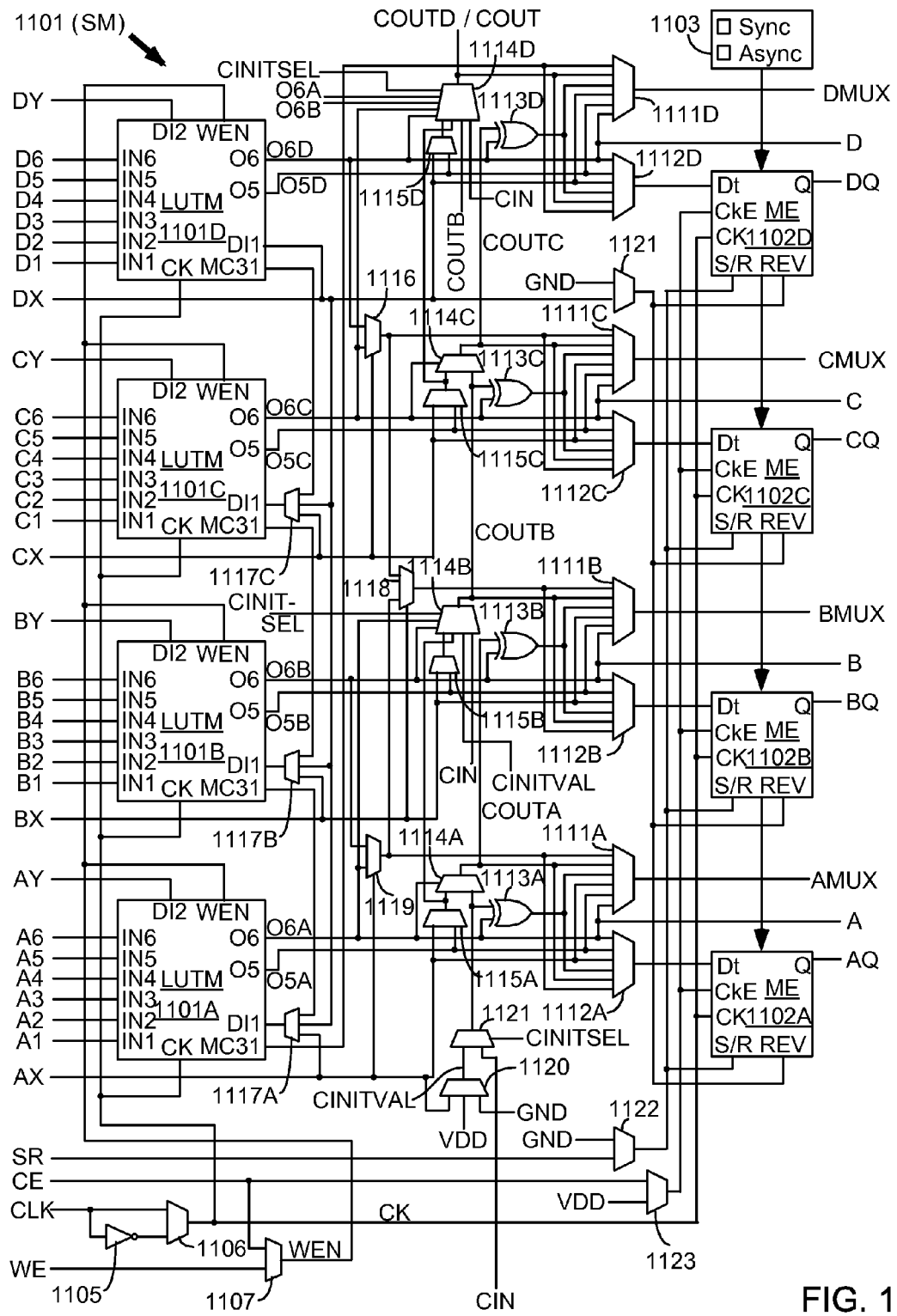
FIG. 11 is a block diagram of a configurable logic element of the device of FIG. 10.

Turning now to FIG. 11, block diagram of a configurable logic element of the device of FIG. 10 is shown. In particular, FIG. 11 illustrates in simplified form a configurable logic element of a configuration logic block 1002 of FIG. 10. In the embodiment of FIG. 11, slice M 1101 includes four lookup tables (LUTMs) 1101A-1101D, each driven by six LUT data input terminals A1-A6, B1-B6, C1-C6, and D1-D6 and each providing two LUT output signals O5 and O6. The O6 output terminals from LUTs 1101A-1101D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1102A-1102D may be programmed to function as a synchronous or asynchronous flip-flop or latch. The selection between synchronous and asynchronous functionality is made for all four memory elements in a slice by programming Sync/Asynch selection circuit 1103. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-IN5), or as one 6-input LUT having input signals IN1-IN6.

In the embodiment of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1106 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device. By implementing the various elements of FIG. 1 in CLBs as will be described in more detail below, the asynchronous transmission of data can be efficiently achieved in existing elements of an a programmable integrated circuit, where each transmitter requires 1 LUT and 2 registers, and each receiver (including the buffer stage) requires 1.5 N LUTs plus 2 registers for a pipeline depth of N.

Figure 12:
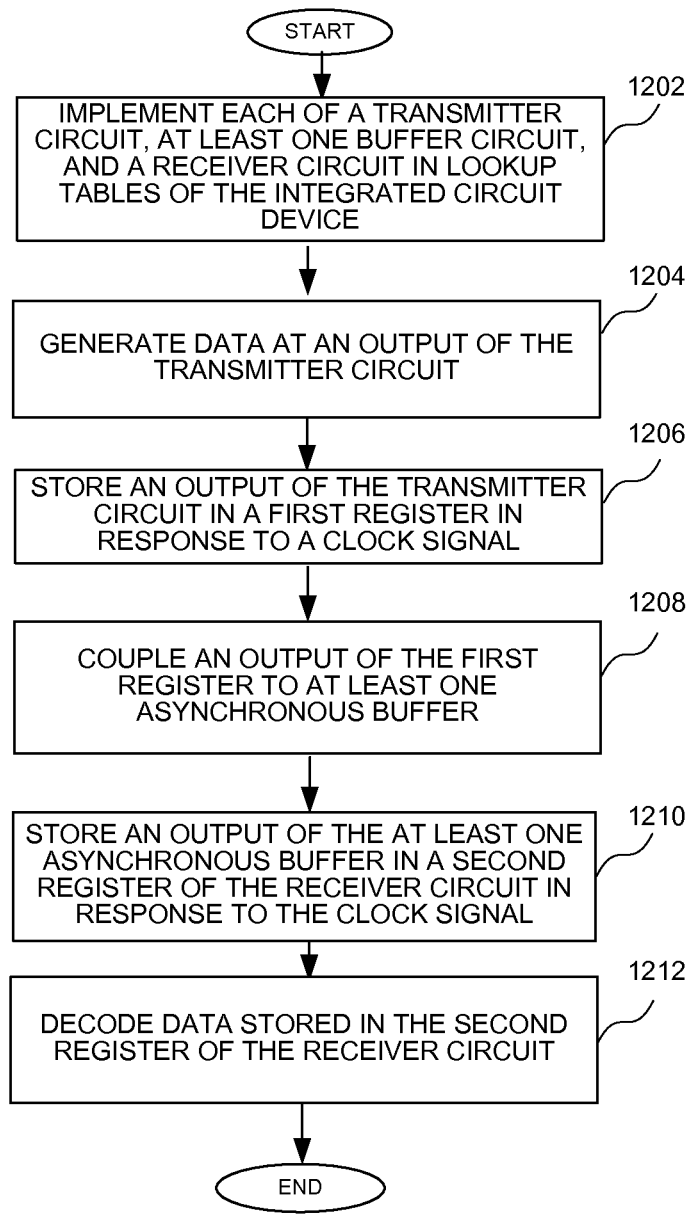
FIG. 12 is a flow chart showing a method of asynchronously transmitting data in an integrated circuit device.

Turning now to FIG. 12, a flow chart shows a method of asynchronously transmitting data in an integrated circuit device. In particular, Each of a transmitter circuit, at least one buffer circuit, and a receiver circuit are implemented in lookup tables of the integrated circuit device at a step 1202. Data is then generated at an output of the transmitter circuit at a step 1204. An output of the transmitter circuit is stored in a first register in response to a clock signal at a step 1206. An output of the first register is coupled to at least one asynchronous buffer at a step 1208. An output of the at least one asynchronous buffer is stored in a second register of the receiver circuit in response to the clock signal at a step 1210. Data stored in the second register of the receiver circuit is decoded at a step 1212. The various elements of the method of FIG. 12 may be implemented using the circuits of FIGS. 1-11 as described, or using some other suitable circuits. While specific elements of the method are described, it should be understood that additional elements of the method, or additional details related to the elements 1202-1212, could be implemented according to the disclosure of FIGS. 1-11.

It can therefore be appreciated that a new integrated circuit device having a circuit for asynchronously transmitting data and method of asynchronously transmitting data in an integrated circuit device has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for asynchronously transmitting data in an integrated circuit, the circuit comprising:
    a transmitter circuit generating data to be transmitted at an output, wherein the transmitter circuit comprises an encoder circuit coupled to receive input data and generate two-phase output data;
    a first register having an input, an output and a clock input, wherein the input of the first register is coupled to the output of the transmitter and the clock input of the first register is coupled to receive a clock signal;
    at least one asynchronous buffer having an input and an output, wherein the input of the at least one asynchronous buffer is coupled to the output of the first register;
    a receiver circuit coupled to the output of the at least one asynchronous buffer; and
    a second register having an input, and output and a clock input, wherein the input of the second register is coupled to the output of the receiver circuit and the clock input of the second register is coupled to receive the clock signal.

2. The circuit of claim 1 further comprising a third register, wherein the first register is coupled to receive a first output of the two-phase output data and the third register is coupled to receive a second output of the two-phase output data.

3. The circuit of claim 1 wherein receiver circuit comprises a decoder circuit coupled to receive the two-phase output data from the at least one asynchronous buffer.

4. The circuit of claim 3 wherein the encoder circuit comprises a LEDR encoder and the decoder circuit comprises a LEDR decoder.

5. The circuit of claim 1 wherein the at least one asynchronous buffer comprises a plurality of buffers corresponding to a plurality of pipeline stages.

6. The circuit of claim 1 further comprising a plurality of look-up tables, wherein the transmitter circuit, the at least one asynchronous buffer, and the receiver circuit are implemented in the plurality of lookup tables.

7. A circuit for asynchronously transmitting data in an integrated circuit, the circuit comprising:
    a transmitter circuit implemented in a first configurable block, wherein data output by the transmitter circuit is generated at an output of a first lookup table of the first configurable block and wherein the transmitter circuit comprises an encoder circuit coupled to receive input data and generate two-phase output data;
    at least one asynchronous buffer implemented in a second configurable block, wherein an input of the at least one asynchronous buffer is coupled to an output of an output register of the first configurable block; and
    a receiver circuit implemented in a third configurable block, wherein an input of the receiver circuit is coupled to an output of a second lookup table of the second configurable block and an output of a lookup table of the third configurable block is coupled to an output register of the third configurable block.

8. The circuit of claim 7 wherein each of the first, second, and third configurable blocks comprises a configurable logic element.

9. The circuit of claim 7, wherein a first register of the first configurable logic block is coupled to receive a first output of the two-phase output data and a second register of the first configurable logic block is coupled to receive a second output of the two-phase output data.

10. The circuit of claim 7 wherein the receiver circuit comprises a decoder circuit coupled to receive the two-phase output data.

11. The circuit of claim 10 wherein the encoder circuit comprises a LEDR encoder and the decoder circuit comprises a LEDR decoder.

12. The circuit of claim 7 wherein the at least one asynchronous buffer comprises a plurality of buffers corresponding to a plurality of pipeline stages.

13. A method of asynchronously transmitting data in an integrated circuit, the method comprising:
    generating data at an output of a transmitter circuit, wherein generating data at the output of the transmitter circuit comprising generating encoded two-phase data;
    storing the data generated at the output of the transmitter circuit in response to a clock signal;
    coupling the stored data to at least one asynchronous buffer; and
    storing an output of the at least one asynchronous buffer in response to the clock signal.

14. The method of claim 13 wherein coupling the stored data to the at least one asynchronous buffer comprises coupling the stored data to a plurality of asynchronous buffers of a pipeline stage.

15. The method of claim 13 further comprising implementing each of the transmitter circuit, the at least one asynchronous buffer circuit and the receiver circuit in lookup tables of the integrated circuit.

16. The method of claim 13 further comprising implementing each of the transmitter circuit, the at least one asynchronous buffer circuit and the receiver circuit in configurable logic elements of the integrated circuit.

17. The method of claim 13 further comprising decoding the output of the at least one asynchronous buffer.

* * * * *